United States Patent
Kang et al.

(10) Patent No.: US 6,791,861 B2
(45) Date of Patent: Sep. 14, 2004

(54) FERROELECTRIC MEMORY DEVICE AND A METHOD FOR DRIVING THE SAME

(75) Inventors: Hee Bok Kang, Taejon-kwangyokshi (KR); Hun Woo Kye, Ichon-shi (KR); Geun Il Lee, Yong-in-shi (KR); Je Hoon Park, Songnam-shi (KR); Jung Hwan Kim, Seoul (KR)

(73) Assignee: Hynix Semiconductor INC, Ichon-shi (KR)

( * ) Notice: Subject to any disclaimer, the term of this patent is extended or adjusted under 35 U.S.C. 154(b) by 0 days.

(21) Appl. No.: 10/233,429

(22) Filed: Sep. 4, 2002

(65) Prior Publication Data

US 2003/0052735 A1 Mar. 20, 2003

(30) Foreign Application Priority Data

Sep. 17, 2001 (KR) .................................... 2001-0057274

(51) Int. Cl.[7] .............................................. G11C 11/22
(52) U.S. Cl. ................... 365/145; 365/149; 365/200.06
(58) Field of Search ................................ 365/145, 149, 365/230.06

(56) References Cited

U.S. PATENT DOCUMENTS

| | | | |
|---|---|---|---|
| 5,424,975 A | * | 6/1995 | Lowrey et al. ............. 365/145 |
| 6,072,711 A | | 6/2000 | Kang |
| 6,091,622 A | | 7/2000 | Kang |
| 6,091,623 A | | 7/2000 | Kang |
| 6,118,687 A | | 9/2000 | Kang |
| 6,118,695 A | | 9/2000 | Yoneyama |
| 6,128,213 A | | 10/2000 | Kang |
| 2002/0006053 A1 | * | 1/2002 | Murakuki ................... 385/145 |

FOREIGN PATENT DOCUMENTS

| | | |
|---|---|---|
| DE | 19915075 | 10/1999 |
| DE | 19923979 | 12/1999 |
| JP | 409121032 A | * 5/1997 |

* cited by examiner

*Primary Examiner*—Huan Hoang
(74) *Attorney, Agent, or Firm*—Jacobson Holman PLLC

(57) ABSTRACT

A ferroelectric memory device includes a plurality of wordlines and a plurality of plate lines, the wordlines and the plate lines being alternately formed at regular intervals in one direction; a plurality of sub bitlines and a plurality of main bitlines, the sub bitlines and the main bitlines alternately formed at regular intervals to cross the wordlines and the plate lines; a plurality of sub cell arrays connected with the wordlines, the sub bitlines and the plate lines, having cells in directions defined by a plurality of rows and columns, the cells in the direction of the rows being arranged every two columns and the cells in the direction of the columns being arranged every two rows, respectively; and switching elements each operating between one of the sub bitlines and one of the main bitlines by an externally applied bitline switch signal of a constant pulse type to selectively connect the sub bitline with the main bitline.

12 Claims, 16 Drawing Sheets

E : electricfield
P : polarity

FERROELECTRIC MEMORY DEVICE AND A METHOD FOR DRIVING THE SAME

This application claims the benefit of the Korean Application No. P2001-57274 filed on Sep. 17, 2001, which is hereby incorporated by reference.

BACKGROUND OF THE INVENTION

1. Field of the Invention

The present invention relates to a semiconductor memory, and more particularly, to a ferroelectric memory device capable of improving the sensing margin of a bitline by reducing capacitance between adjacent bitlines and a method for driving the ferroelectric memory.

2. Discussion of the Related Art

Generally, nonvolatile ferroelectric memory, i.e., ferroelectric random access memory (FRAM) has a data processing speed equal to that of dynamic random access memory (DRAM) and retains data even when power is turned off. For this reason, the nonvolatile ferroelectric memory has lately attracted considerable attention as a next generation memory device.

The FRAM and DRAM have similar structures as memory devices, but the FRAM includes a ferroelectric capacitor, which is characteristic of high residual polarization. Such a ferroelectric capacitor permits its data to be retained even when electric field is removed.

FIG. 1 is a conventional characteristic diagram showing a hysteresis loop of a general ferroelectric device. As shown in FIG. 1, the polarization induced by electric field maintains its state at a certain amount (i.e., at the state of "d" or "a") without being erased due to the presence of residual polarization (or spontaneous polarization) even when electric field is removed. A nonvolatile ferroelectric memory cell can be used as a memory device such that the state of "d" or "a" correspond to the logic value of "1" or "0" respectively.

FIG. 2 is a schematic diagram showing a unit cell of the general nonvolatile ferroelectric memory device.

As shown in FIG. 2, the nonvolatile ferroelectric memory device includes a bitline B/L formed in one direction, a wordline W/L formed in a direction crossing the bitline B/L, a plate line P/L spaced apart from the wordline W/L in a parallel direction with the wordline W/L, a transistor T1 having a gate electrode connected with the wordline W/L and a source electrode connected with the bitline B/L, and a ferroelectric capacitor FC1 having a first terminal connected with a drain of the transistor T1 and a second terminal connected with the plate line P/L.

A data input and output operation of the aforementioned nonvolatile ferroelectric memory device will be described below.

FIG. 3A is a timing diagram showing a write mode operation of the nonvolatile ferroelectric memory device, and FIG. 3B is a timing diagram showing a read mode operation of nonvolatile ferroelectric memory device.

First, in the write mode operation, a chip enable signal CSBpad applied externally is enabled from high to low. At the same time, if a write enable signal WEBpad is applied from high to low, the write mode operation will start. Subsequently, if address decoding is activated in the write mode operation, a pulse applied to a corresponding wordline W/L will be transited from low to high in order to select a cell.

As described above, during a period of the wordline W/L maintaining at high state, a high signal with a certain period and a low signal with a certain period are sequentially applied to a corresponding plate line P/L. In order to write a logic value "1" or "0" in the selected cell, a high or low signal synchronized with the write enable signal WEBpad is applied to a corresponding bitline B/L.

In other words, a high signal is applied to the bitline B/L, and if a low signal is applied to the plate line P/L in the period during which the signal applied to the wordline W/L is high, a logic value "1" is written in the ferroelectric capacitor FC1.

And a low signal is applied to the bitline B/L, and if the signal applied to the plate line P/L is high, a logic value "0" is written in the ferroelectric capacitor FC1.

An explanation will be given below as to the read mode operation, data of which has been stored in a cell by the write mode operation.

As shown in FIG. 3B, if the chip enable signal CSBpad applied externally is enabled from high to low, all of bitlines B/L will be equipotential to a low voltage by an equalizer signal EQ before the corresponding wordline W/L is selected.

The corresponding bitline B/L becomes inactive. Then an address is decoded, and the corresponding wordline W/L is transited from low to high according to the decoded address in order to select the corresponding cell.

Subsequently, a high signal is applied to the plate line P/L of the selected cell in order to destroy the data corresponding to the logic value "1" stored in the ferroelectric memory. If the logic value "0" is stored in the ferroelectric memory, the corresponding data will not be destroyed.

As described above, the data destroyed or non-destroyed are output as values different with each other according to the principle of hysteresis loop, and thereby the logic value "1" or "0" is sensed by a sensing amplifier. In other words, as shown in the hysteresis loop of FIG. 1, if the data is destroyed, the "d" state is changed to the "f" state, whereas if the data is not destroyed, the "a" state is changed to the "f" state.

Thus, if the sensing amplifier is enabled after a constant time elapses, the logic value "1" is output in the case where the data is destroyed, while the logic value "0" is output in case where the data is not destroyed.

As described above, after the data is output by the sensing amplifier, it should be recovered to its original data, the plate line P/L disabled from high to low during the state in which a high signal is applied to the corresponding wordline W/L.

A conventional ferroelectric memory device and a method for driving the same will be described below with reference to the accompanying drawings.

FIG. 4 is a circuit diagram showing the conventional nonvolatile ferroelectric memory element.

As shown in FIG. 4, a unit cell of the conventional nonvolatile ferroelectric memory element formed in the row direction includes a first split wordline SW1 and a second split word line SW2 which are parallel with each other, a first bitline BL1 and a second bitline BL2 formed crossing the first and the second split wordlines SW1 and SW2, a first transistor T1 having a gate connected to the first split wordline SWL1 and a drain connected to the first bitline BL1, a first ferroelectric capacitor FC1 connected between a source of the first transistor T1 and the second split wordline SWL2, a second transistor T2 having a gate connected to the second split wordline SWL2 and a drain connected to the second bitline BL2, and a second ferroelectric capacitor FC2 connected between a source of the second transistor T2 and the first split wordline SWL1.

FIG. 5 is another circuit diagram showing the conventional nonvolatile ferroelectric memory device.

As shown in FIG. 5, the conventional nonvolatile ferroelectric memory device includes a plurality of pairs of split word lines having a pair of a first and a second split wordlines SWL1, SWL2 in the row direction, a plurality of pairs of bitlines having a pair of adjacent two bitlines BL1, BL2 in a direction crossing the pairs of wordlines SW1, SW2, a plurality of sensing amplifiers SA located between the pair of bitlines BL1, BL2 and serving to sense data received via both the bitlines BL1, BL2 and transmit the data to a data line DL or a data bar line /DL.

Here, a sensing amplifier enabling part (not shown) outputs a sensing amplifier enable signal SEN to enable the sensing amplifiers, a selection switching part CS switches the bitlines, and additionally, the data lines are selectively formed.

FIG. 6 is a timing diagram showing an operation of the conventional nonvolatile ferroelectric memory element.

A period T0 shown in FIG. 6 prior to a period during which the first split wordline SWL1 and the second split wordline SWL2 are enabled to high, is precharged to a constant level for all the bitlines. Then, during a T1 period, both the first split wordline SWL1 and the second split wordline SWL2 are high, so that the data of ferroelectric capacitor is transmitted to a bitline BL so that the level of the bitline BL is changed.

At this time, since the ferroelectric capacitor stored as logic "1" is subjected to the opposite polarities of electric fields on the bitline and wordline, the polarity of the ferroelectric memory element is destroyed, and high current is generated and accordingly high voltage is induced to the bitline.

On the contrary, since the ferroelectric capacitor stored as logic "0" is subjected to the same polarities of electric fields on the bitline and wordline, the polarity of ferroelectric memory element is not destroyed, and low current is generated and accordingly low voltage is induced to the bitline.

When a cell data is loaded sufficiently on the bitline, the sensing amplifier enable signal SEN is transited to high in order to enable the sensing amplifier, and the level of the bitline is amplified. However, since the data of logic "1" in the cell which has been destroyed cannot be recovered at the state in which both the first split wordline SW1 and the second split wordline SW2 are high, it should be restored in the following periods T2, T3.

Then, during the period T2 of the first split wordline SWL1 being transited to a low level and the second split wordline SWL2 maintaining a high level, the second transistor T2 is turned on.

At this time, if the corresponding bitline is at a high level, high data is transmitted to an electrode of the second ferroelectric capacitor FC2, it will be restored to the logic "1" between a low level of the first split wordline SWL1 and a high level of the bit line.

Then, during the period T3 of the first split wordline SWL1 being transited to high again and the second split wordline SWL2 is transited to low, the first transistor T1 is turned on.

At this time, if the corresponding bitline is at a high level, a high data will be transmitted to an electrode of the first ferroelectric capacitor FC1, and the logic "1" is restored between a low level of the second split wordline SWL2 and a high level of the bit line.

Then, the T4 period is a precharge period during which a next cycle operation is prepared.

FIG. 7 is a diagram showing a folded bitline cell array for the conventional nonvolatile ferroelectric memory device.

The conventional 1T/1C FRAM unit cell is the 1T/1C having one transistor and one capacitor, similar to DRAM in structure.

As shown FIG. 7, the conventional 1T/1C FRAM includes a plurality of wordlines WL1, WL2 arranged parallel with each other, a plurality of plate lines PL1, PL2 arranged parallel to the wordlines WL1, WL2 between each pair of the wordlines WL1, WL2, and a plurality of bitlines BL1, BL2, BL3, BL4, . . . arranged parallel with each other and perpendicular to the wordlines WL1, WL2 and the plate lines PL1, PL2.

The conventional 1T/1C FRAM also includes a plurality of unit cells are arranged in a folded type. In other words, each unit cell includes a transistor having a gate electrode connected to the wordline WL1, a source electrode connected to the adjacent bitline BL1, a drain electrode connected to a first electrode of a ferroelectric capacitor. A second electrode of the ferroelectric capacitor is connected to the adjacent plate line PL1.

However, a gate electrode of another transistor included in the unit cell is connected to the wordline WL2, a source electrode of the transistor is connected to the adjacent bitline BL2, a drain electrode of the transistor is connected to a first electrode of a ferroelectric capacitor, and a second electrode of the ferroelectric capacitor is connected to the adjacent plate line PL2.

Here, the respective cell arrays include cells in row and columns directions, and the cells in the row direction are arranged per every other column, and similarly, the cells in the column direction are arranged per every other row.

However, as for a bitline cell array of the conventional ferroelectric memory device, when the wordline WL1 and the plate line PL1 are enabled, only the cells connected with the odd numbers of the bitlines BL1, BL3 or the even numbers of the bitlines BL2, BL4 are selected, and the even numbers of the bitlines BL2, BL4 or the odd numbers of bitlines BL1, BL3, which are not selected, will be regarded as reference lines or driver lines.

FIG. 8 is a timing diagram showing the operation of a folded bitline cell array for the conventional ferroelectric memory device.

As shown in FIG. 8, a chip enable signal ICE is disabled to low during a period b1. During a period b2, both a wordlines WL and a plate lines PL are enabled to high and cell data are loaded on the bitlines BL. Accordingly, high or low sensing data will appear on the bitlines BL.

During a period b3, the sensing amplifier enable signal SAE is enabled from low to high, and the bitline BL data is amplified by the sensing amplifier enable signal SAE. During a period b4, the logic "0" is written to the cell, and the logic "1" is written to the cell during a period b5. The periods b4 and b5 are defined as the cell data store or write periods. In other words, they are periods during which the bitline data are newly written or rewritten to the cell in the write or read mode. During a period b6, the bitlines BL and others are precharged for a next cycle.

However, the aforementioned conventional ferroelectric memory device and a method for driving the conventional ferroelectric memory device have the following problems. That is, the capacitance between adjacent bitlines is increased, and as a result the bitline sensing margin is decreased.

SUMMARY OF THE INVENTION

Accordingly, the present invention is directed to a ferroelectric memory device and a method for driving the same that substantially obviates the conventional problems due to limitations and disadvantages of the related art.

An object of the present invention is to provide a ferroelectric memory device and a method for driving the same in which hierarchical structure is adopted for bitlines, thereby reducing the capacitance in order to improve the sensing margin of bitlines.

In accordance with the purpose of the invention to achieve this object, a ferroelectric memory device includes a plurality of wordlines and a plurality of plate lines, the wordlines and the plate lines being alternately formed at regular intervals in one direction; a plurality of sub bitlines and a plurality of main bitlines, the sub bitlines and the main bitlines alternately formed at regular intervals to cross the wordlines and the plate lines; a plurality of sub cell arrays connected with the wordlines, the sub bitlines and the plate lines, having cells in directions defined by a plurality of rows and columns, the cells in the direction of the rows being arranged every two columns and the cells in the direction of the columns being arranged every two rows, respectively; and switching elements each operating between one of the sub bitlines and one of the main bitlines by an externally applied bitline switch signal of a constant pulse type to selectively connect the sub bitline with the main bitline.

Also, in accordance with the purpose of the invention to achieve this object, a method for driving a ferroelectric memory device includes the steps of selecting only cells connected with odd numbers of bitlines or even numbers of bitlines by activating a corresponding bitline switching signal to connect a main bitline with an adjacent sub bitline when a wordline and a plate line are enabled, and using the even numbers of bitlines or the odd numbers of bitlines, which have not been selected, as the reference line, the ferroelectric memory device includes a plurality of wordlines and plate lines formed alternatively each other to have regular spacing in one direction, a plurality of sub bitlines and main bitlines formed alternatively each other to have regular spacing in a direction to cross the wordlines and plate lines, cells connected with the wordlines, sub bitlines and plate lines in directions defined by a plurality of rows and columns, a plurality of sub cell arrays having the cells in the direction of the rows to be arranged every other column respectively as well as the cells in the direction of the columns to be arranged every other row respectively, and switching elements each connecting one of the sub bitline with one of the main bitline selectively between the sub bitline and the main bitline by operation of the bitline switch signal applied externally in a constant pulse type.

It is to be understood that both the foregoing general description and the following detailed description of the present invention are exemplary and explanatory and are intended to provide further explanation of the invention as claimed,

BRIEF DESCRIPTION OF THE DRAWINGS

The accompanying drawings, which are included to provide a further understanding of the invention and are incorporated in and constitute a part of this application, illustrate the embodiments of the invention and serve to explain the principle of the invention together with the description. In the drawings.

DETAILED DESCRIPTION OF THE INVENTION

Reference will now be made in detail to the preferred embodiments of a ferroelectric memory device and a method for driving the same in accordance with the present invention, examples of which are illustrated in the accompanying drawings.

Figure 1:
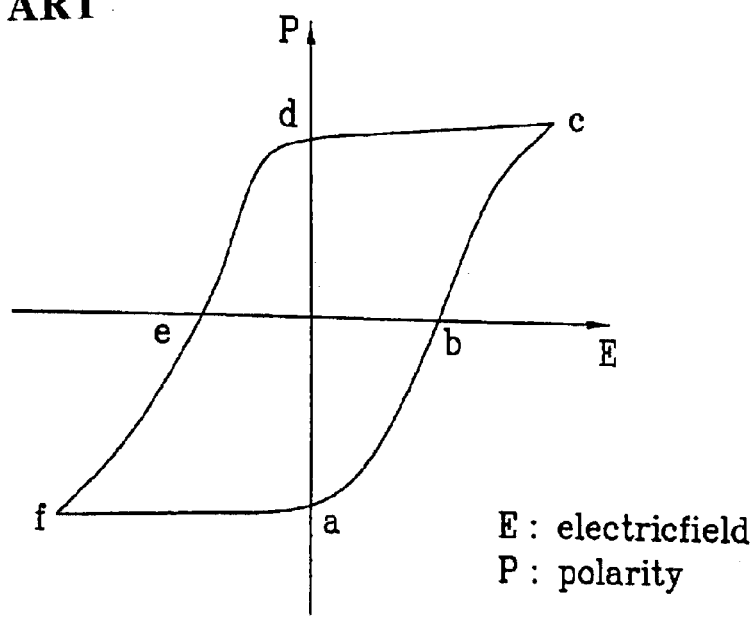
FIG. 1 is a characteristic diagram showing a hysteresis loop of general ferroelectric memory device.
Figure 2:
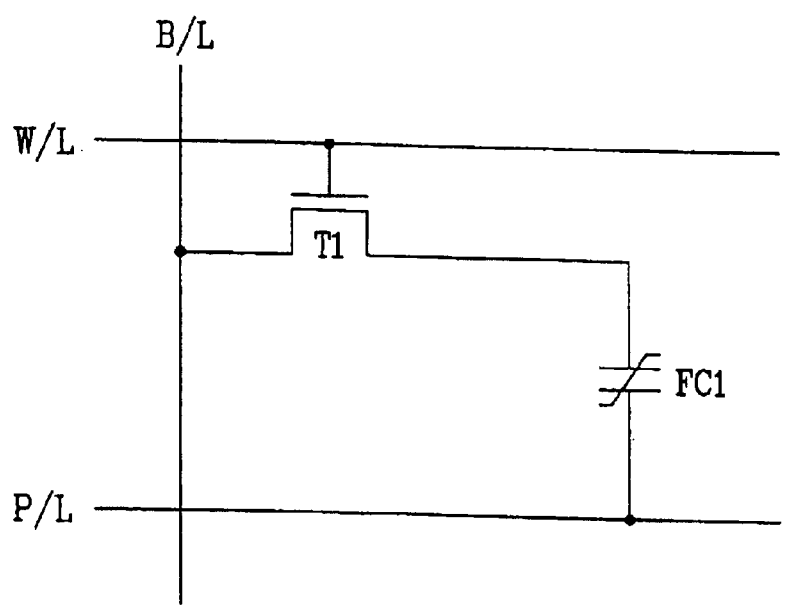
FIG. 2 is a schematic diagram showing the unit cell of a general nonvolatile ferroelectric memory device.
Figure 3A:
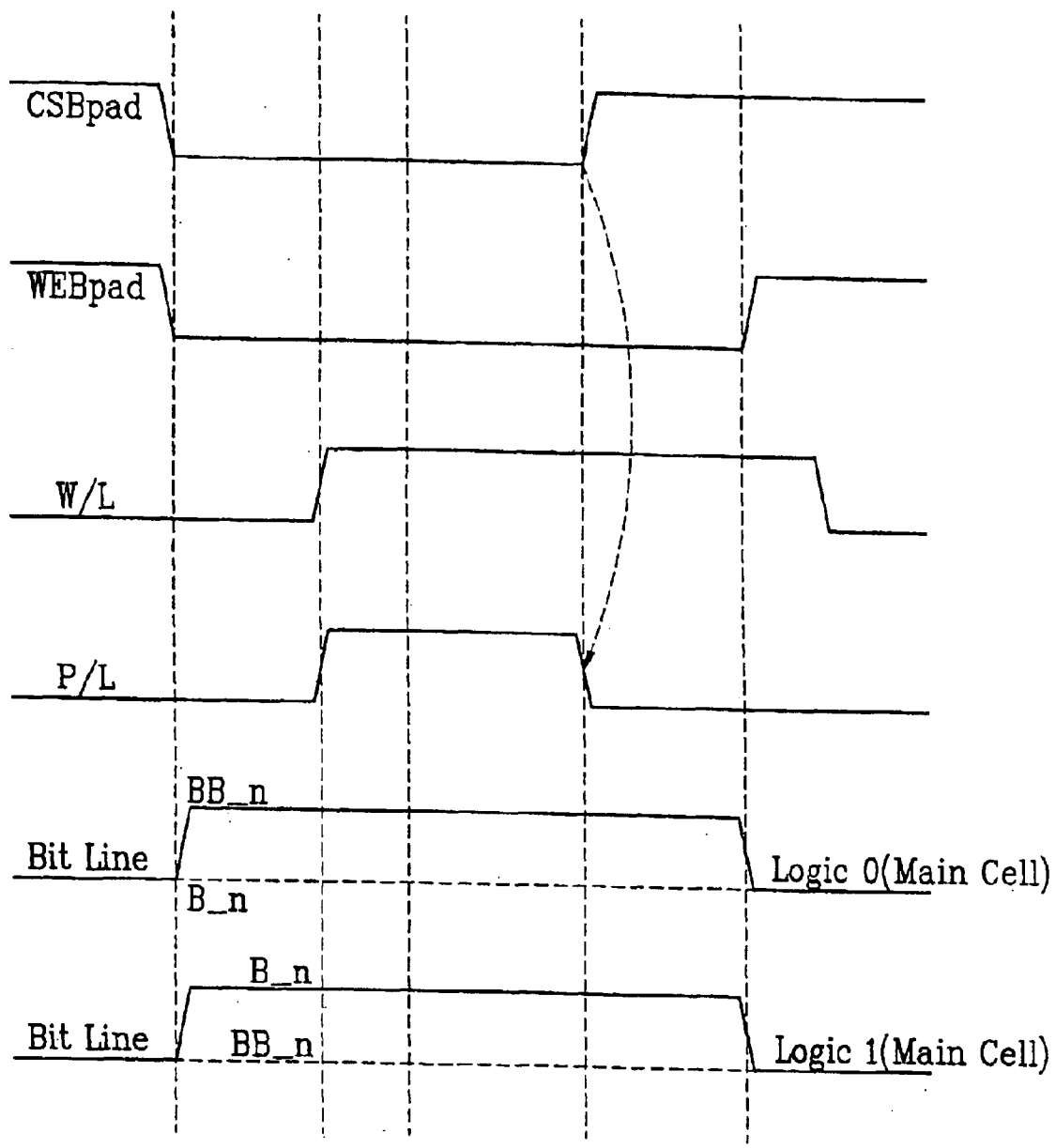
FIG. 3A is a timing diagram showing a write mode operation of a conventional ferroelectric memory device.
Figure 3B:
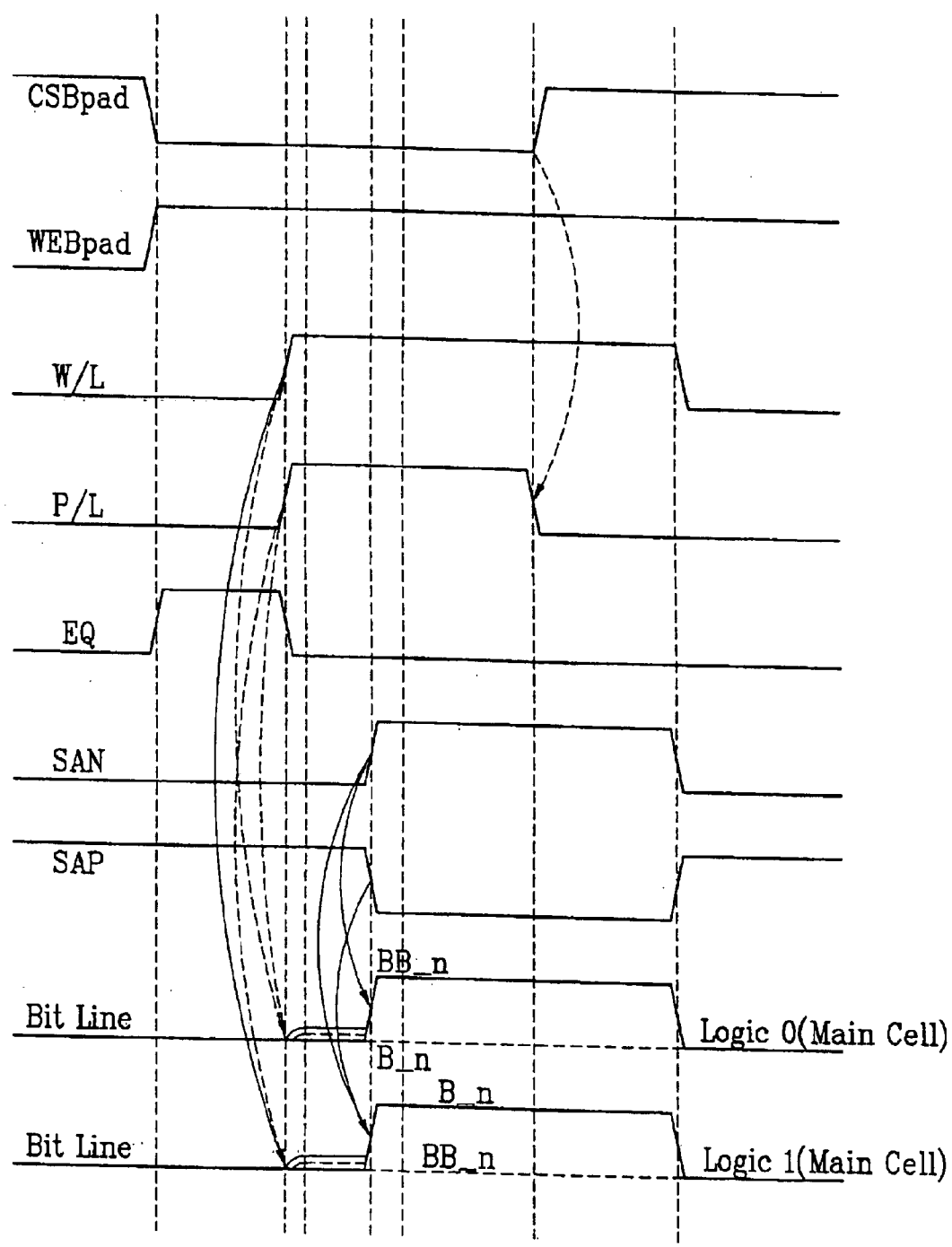
FIG. 3B is a timing diagram showing a read mode operation of the conventional ferroelectric memory device.
Figure 4:
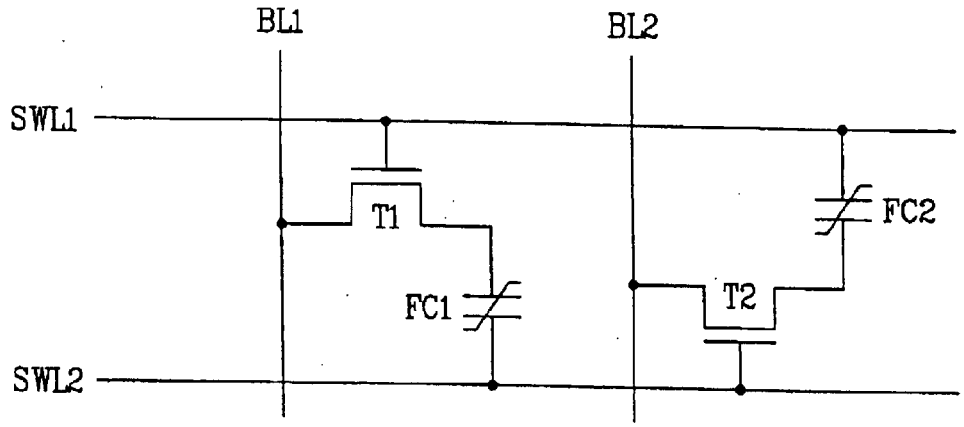
FIG. 4 is a circuit diagram showing a conventional nonvolatile ferroelectric memory device.
Figure 5:
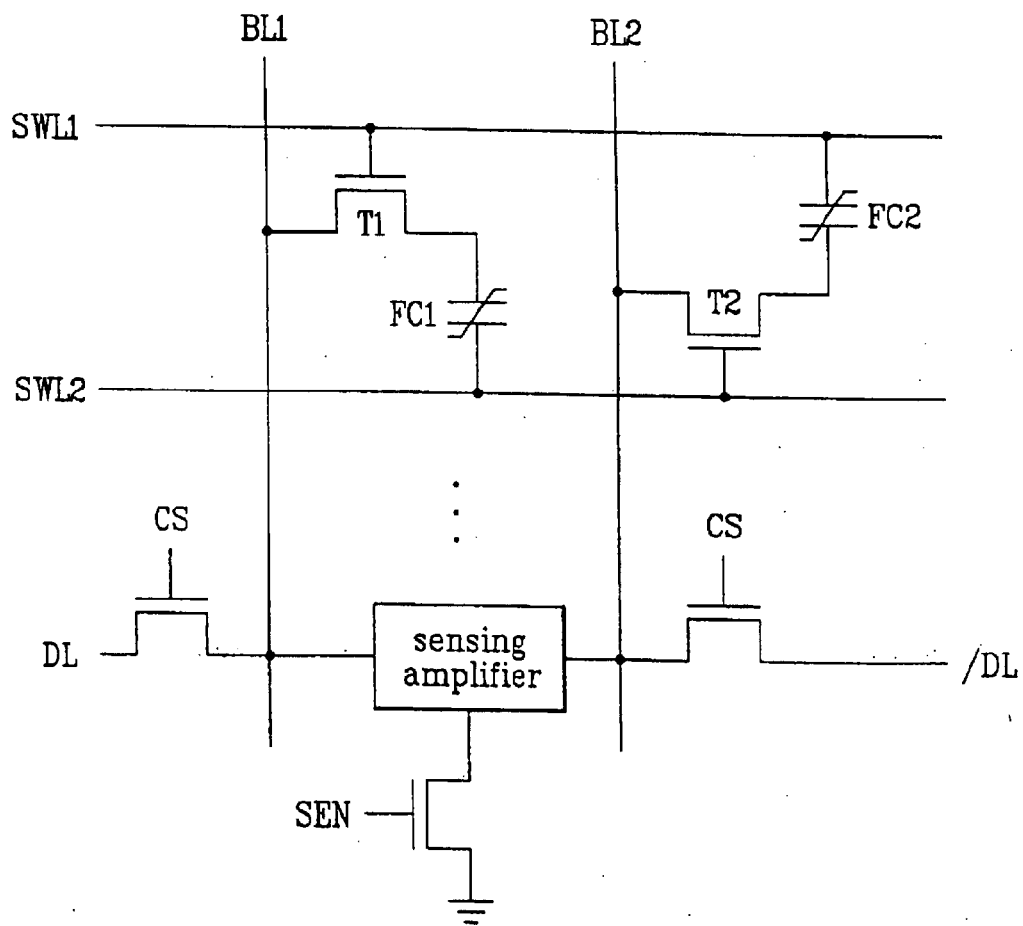
FIG. 5 is a circuit diagram showing the conventional nonvolatile ferroelectric memory device.
Figure 6:
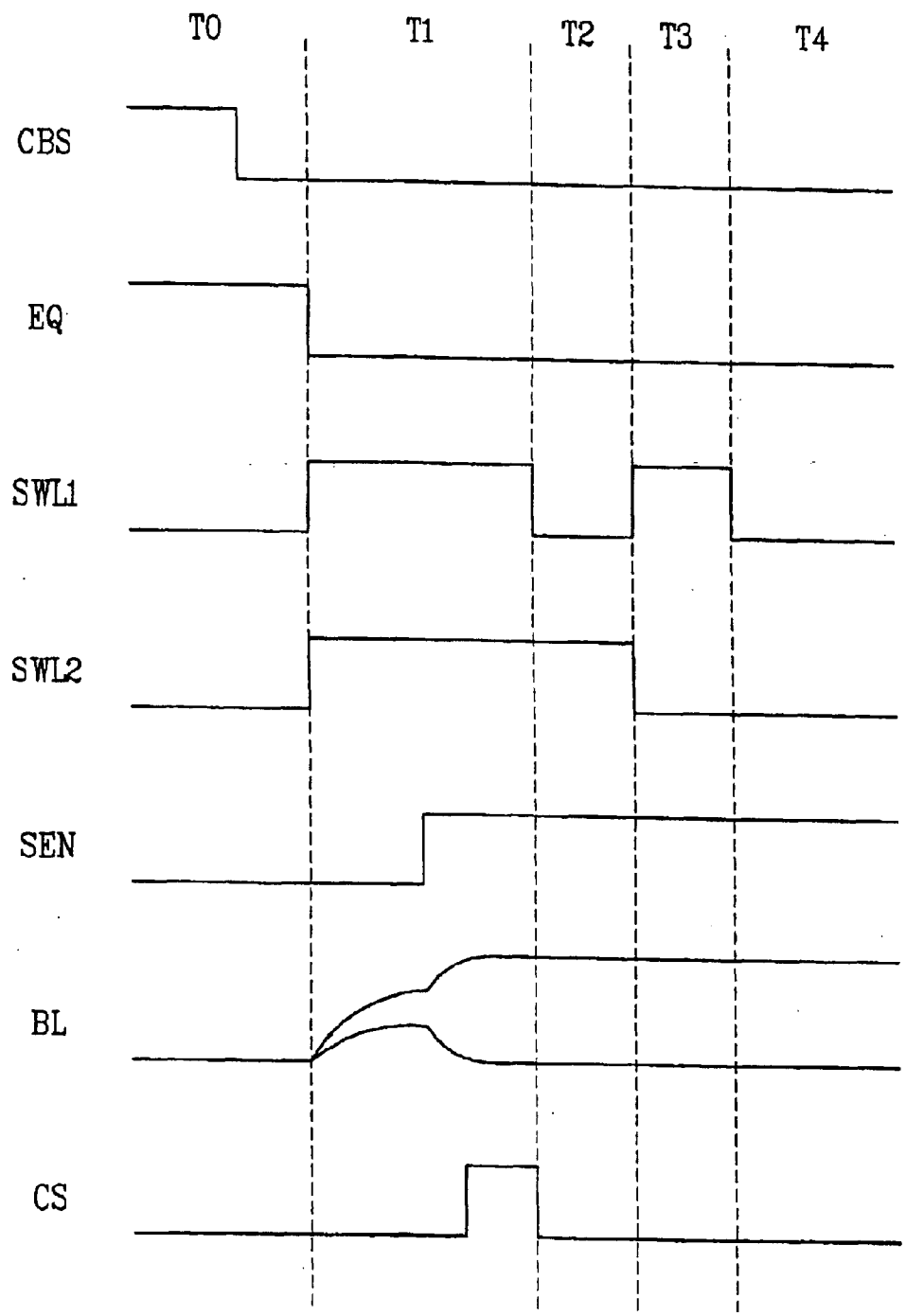
FIG. 6 is a timing diagram showing an operation of the conventional nonvolatile ferroelectric memory device.
Figure 7:
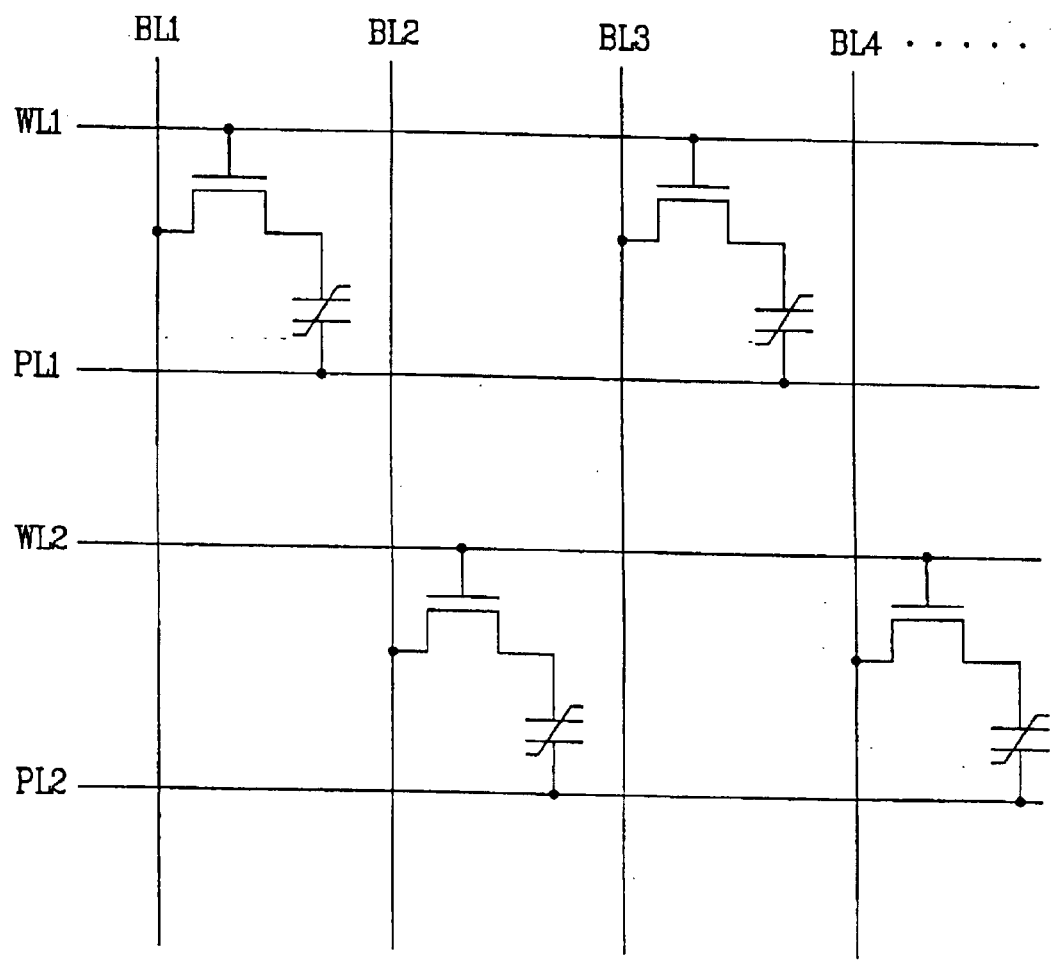
FIG. 7 is a schematic diagram showing a folded bitline cell array for the conventional ferroelectric memory device.
Figure 8:
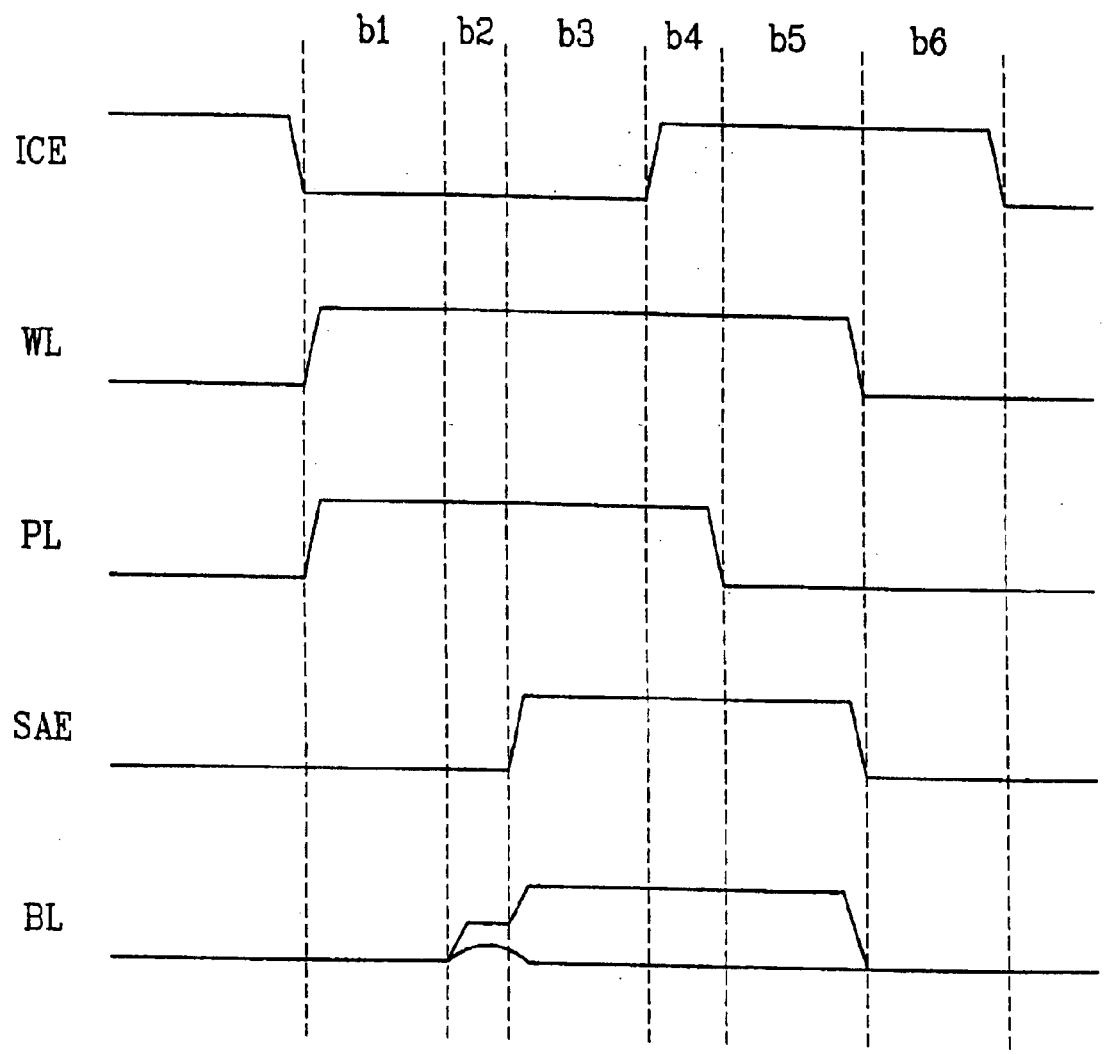
FIG. 8 is a timing diagram showing an operation of the folded bitline cell array for the conventional nonvolatile ferroelectric memory device.
Figure 9:
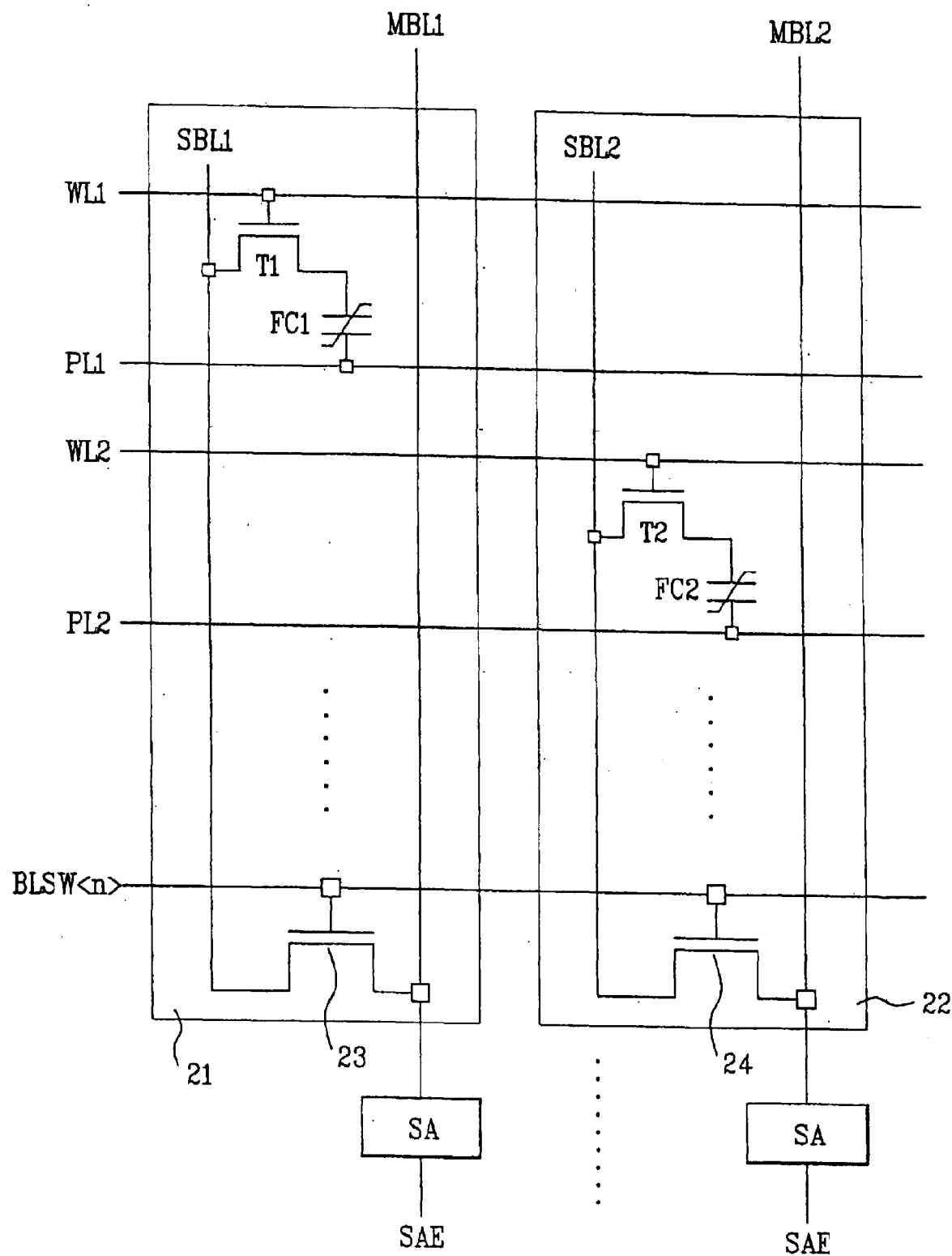
FIG. 9 is a schematic diagram showing a hierachical folded bitline cell array for a nonvolatile ferroelectric memory device according to the present invention.

FIG. 9 is a schematic diagram showing a hierarchical folded bitline cell array for a nonvolatile ferroelectric memory device according to the present invention.

As shown in FIG. 9, the hierarchical folded bitline cell array includes first and the second sub cell arrays 21 and 22 including a plurality of unit cells arranged regularly in row and column directions, and first and second switching elements 23 and 24 selectively connecting a main bitline MBL with a sub bitline SBL.

The first and the second switching elements 23 and 24 transmit signals of the first and second sub cell arrays 21 and 22 to the main bitlines MBL or to transmit signals of the main bitlines MBL to the sub cell arrays 21 and 22.

Also, a bitline includes first and second sub bitlines SBL1 and SBL2 and first and second main bitlines MBL1 and MBL2 arranged parallel with each other.

The hierarchical folded bitline cell array further includes first and second wordlines WL1 and WL2 and first and second plate lines PL1 and PL2, which are arranged parallel with each other and in a direction crossing the first and second sub bitlines SBL1 and SBL2 and the first and second main bitlines MBL1 and MBL2.

The first plate line PL1 is arranged between the first and second wordlines WL1 and WL2 in parallel with the wordlines, and the second plate line PL2 is arranged at one side of the second wordline WL2. In other words, the wordlines and plate lines are arranged alternately.

Also, a unit cell connected with the respective lines includes a T1 having a gate electrode connected with the first wordline WL1, a source electrode connected with the first sub bitline SBL1, and a drain connected with the first ferroelectric capacitor FC1, and a T2 having a gate electrode connected with the second wordline WL2, a source electrode connected with the second sub bitline SBL2, and a drain connected with the second ferroelectric capacitor FC2.

The first switching element 23 is connected with the first sub bitline SBL1 and the first main bitline MBL1, and the second switching element 24 is connected with the second sub bitline SBL2 and the second main bitline MBL2.

The first and second switching elements 23 and 24 include NMOS transistors in which respective gates thereof are selectively connected with the sub bitlines and the main bitlines by a bitline switch signal BLSW<n> in the type of a constant pulse applied externally.

Also, the ends of the first and second main bitlines MBL1 and MBL2 are connected with sensing amplifiers SA operated by receiving a sensing amplifier enable signal SAE applied externally.

In addition, the respective sub cell arrays according to the present invention include unit cells in directions of a plurality of rows and columns.

The respective cells in the row direction are arranged per two columns, and the respective cells in the column direction are arranged per two rows.

Therefore, in the aforementioned hierarchical folded bitline cell array for the ferroelectric memory device according to the present invention, only the cells connected with the odd bitlines or the even bitlines are selected by enabling the corresponding bitline switch signal BLSW<n> to connect a main bitline with the adjacent sub bitline when the wordline WL1 and the plate line PL1 are enabled, and as a result, the other even and odd bitlines, which have not been selected, are used as the reference lines.

Figure 10:
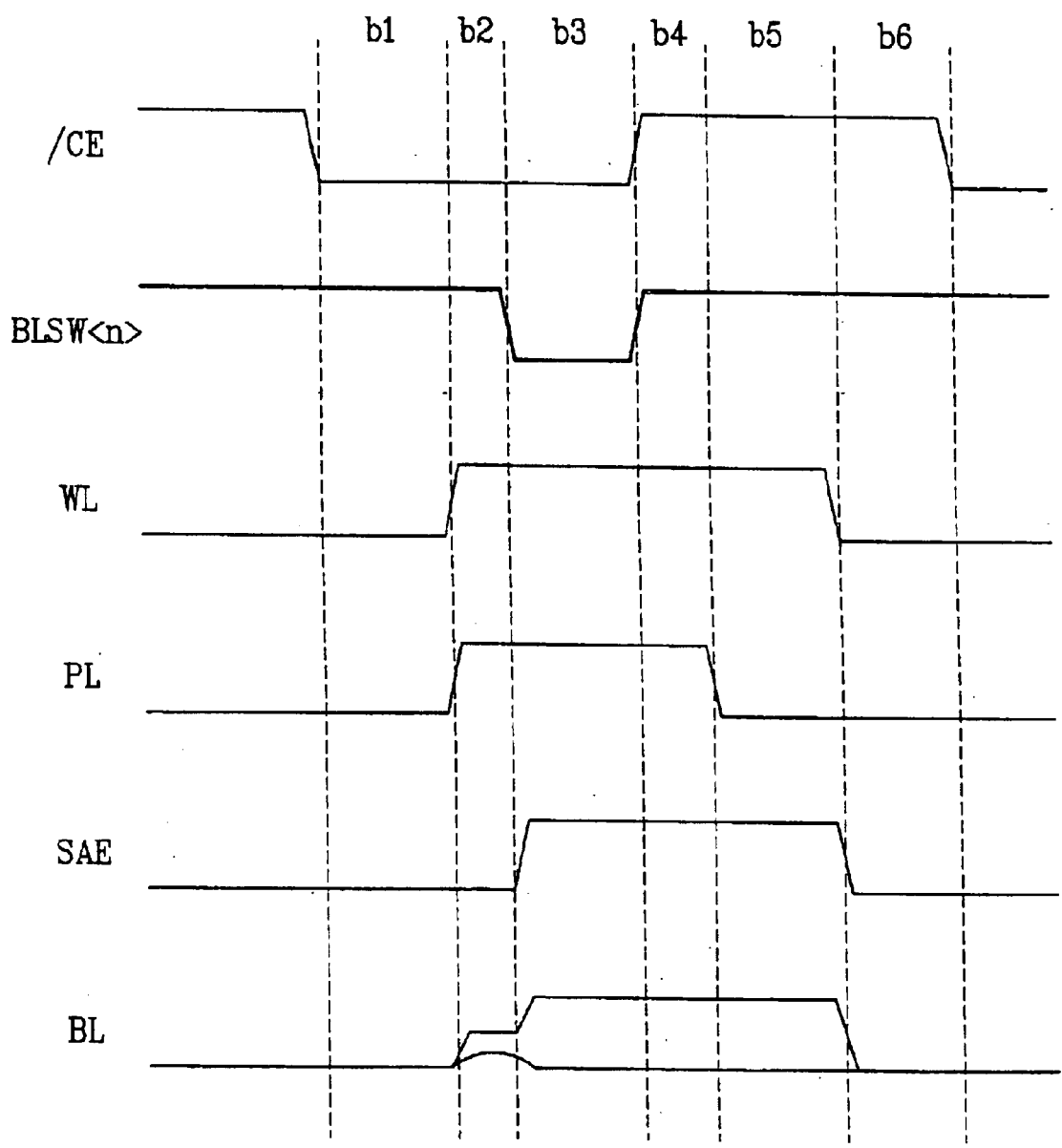
FIG. 10 is a timing diagram showing an operation according to the first embodiment of FIG. 9.

FIG. 10 is a timing diagram showing an operation according to the first embodiment of FIG. 9.

As shown in FIG. 10, the chip enable signal/CS is disabled to low during a period b1.

During a period b2, both a wordline WL and a plate line PL are switched to high and cell data is loaded on a bitline BL. Accordingly, high or low sensing data will appear on the bitline BL.

During a period b3, the sensing amplifier enable signal SAE is enabled from low to high, and thereby the bitline BL data is amplified by the sensing amplifier enable signal SAE.

On the other hand, during the period b3, the bitline switch signal BLSW<n> is disabled from high to low. That is, the bitline switch signal BLSW<n> is disabled when the sensing amplifier is enabled, and thereby a sensing margin will be improved by equalizing the condition of capacitance loads with a reference bitline and a main bitline MBL.

During a period b4, the logic "0" is written in the cell. During a period b5, the logic "1" is written in the cell. The periods b4 and b5 are defined as periods of storing or writing the cell data. That is, they are the periods during which the data of bitlines are newly written or rewritten in the cell in the write or read mode.

During a period b6, the bitlines BL and others are precharged for a next cycle.

Figure 11:
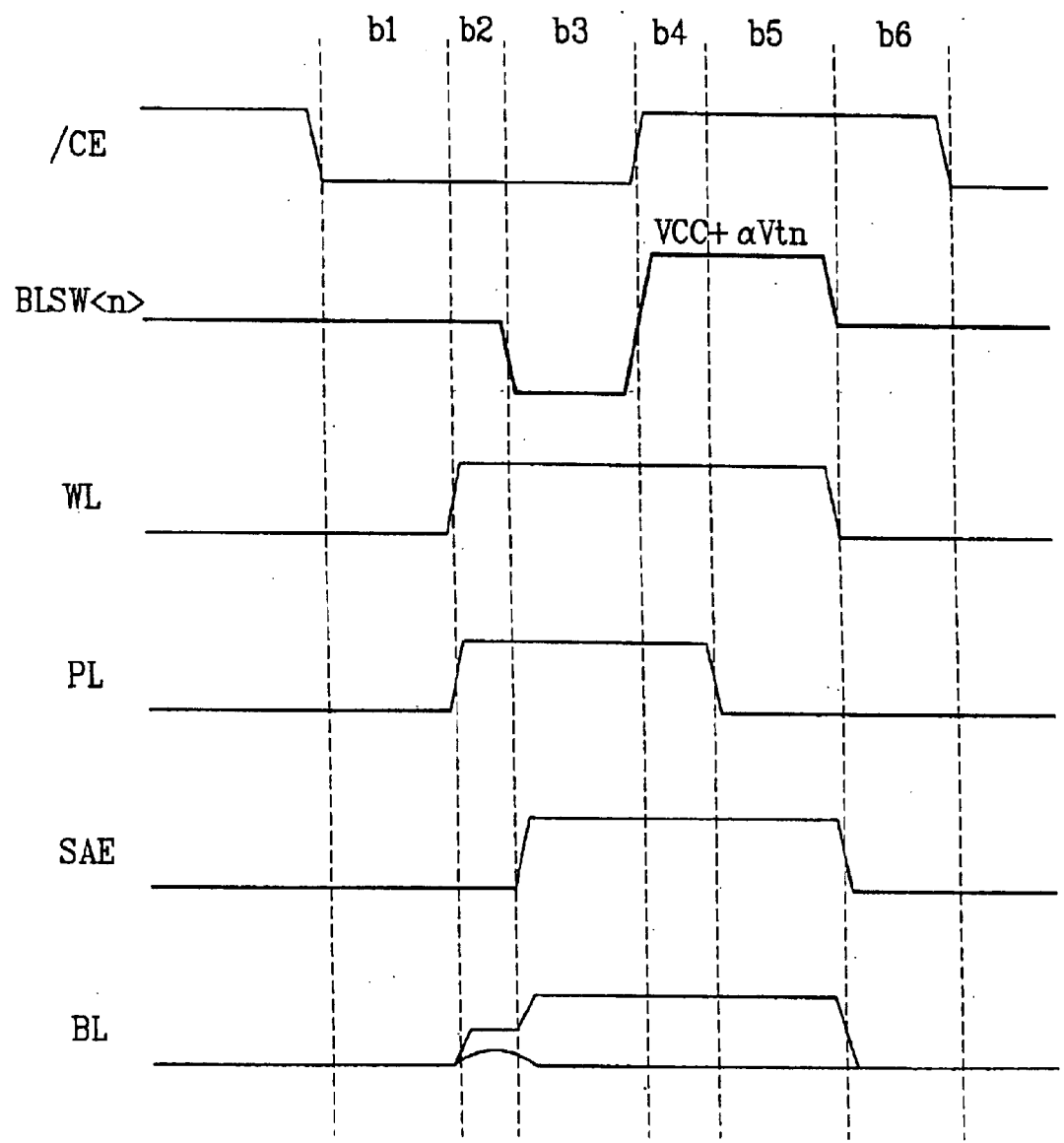
FIG. 11 is a timing diagram showing an operation according to the second embodiment of FIG. 9.

FIG. 11 is a timing diagram showing the operation according to the second embodiment of FIG. 9

As shown in FIG. 11, during the period b3, the bitline switch signal BLSW<n> is disabled to low, but the sensing amplifier enable signal SAE is enabled.

Also, during the periods b4 and b5 of the cell data being stored, the bitline switch signal BLSW<n> is boosted to a voltage VCC+αVtn higher than VCC, and thereby a voltage of main bitline MBL can be transmitted to the sub bitline SBL without voltage loss. Here, the Vtn is the same as a threshold voltage of the transistor.

Figure 12:
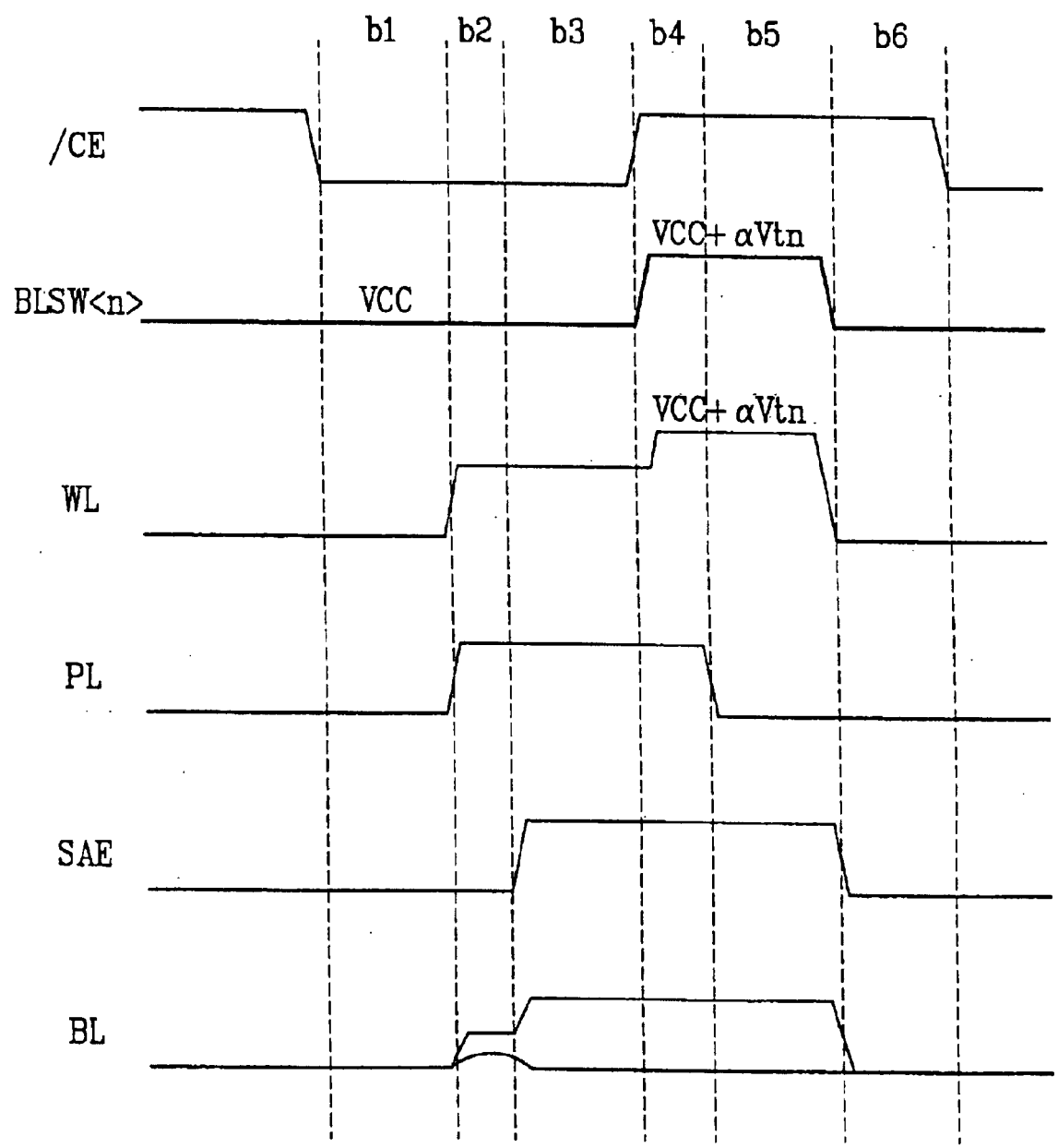
FIG. 12 is a timing diagram showing an operation according to the third embodiment of FIG. 9.

FIG. 12 is a timing diagram showing an operation according to the third embodiment of FIG. 9.

As shown in FIG. 12, the sensing amplifier enable signal SAE is enabled while the bitline switch signal BLSW<n> is maintained at high level continuously.

Also, during the periods b4 and b5 of the cell data being stored, the bitline switch signal BLSW<n> is boosted to the voltage VCC+αVtn higher than VCC, and thereby the voltage of main bitline MBL can be transmitted to the sub bitline SBL without voltage loss.

Here, during the periods b4 and b5, the bitline switch signal BLSW<n> is boosted to the voltage VCC+αVtn, and the wordline WL, which becomes VCC during the periods b2 and b3, becomes VCC+αVtn.

However, during the rest periods excluding periods b4, b5, the bitline switch signal BLSW<n> maintains the voltage of VCC.

Figure 13:
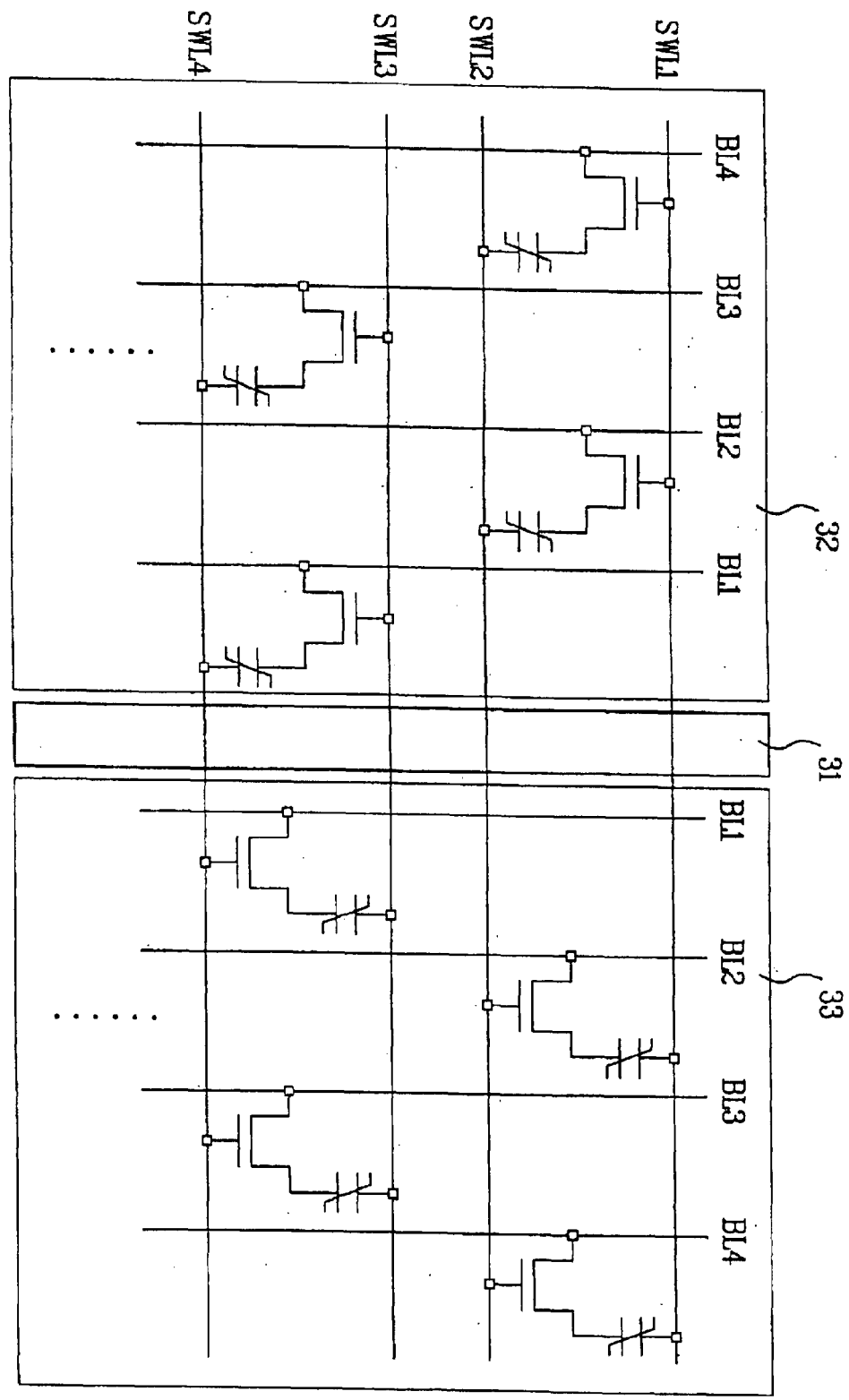
FIG. 13 is a schematic diagram showing a hierachical folded bitline cell array having a split wordline cell array structure for a ferroelectric memory device according to the present invention.

FIG. 13 is a schematic diagram showing a hierachical folded bitline cell array having the structure of a split wordline cell array for the ferroelectric memory device according to the present invention.

As shown in FIG. 13, the hierarchical folded bitline cell array includes a plurality of unit cells respectively at both sides around a split wordline driver 31, and first and second cell arrays 32 and 33 arranged regularly in column and row directions.

Each of the first and second cell arrays 32 and 33 includes a plurality of split wordlines SWL1, SWL2, SWL3, SWL4, . . . formed at regular intervals in one direction, and a plurality of bitlines BL1, BL2, BL3, BL4, . . . formed at regular intervals and in a direction perpendicular to the split wordlines SWL1, SWL2, SWL3, SWL4, . . . .

A unit cell of the first cell array 32 includes a transistor having a gate electrode connected with the first split wordline SWL1, a source electrode connected with the first bitline BL1, and a capacitor having a first electrode connected with a drain electrode of the transistor and a second electrode connected with the second split wordline SWL2.

Also, a unit cell of the second cell array 33 includes a transistor having a gate electrode connected with the second split wordline SWL2, a source electrode connected with the first bitline BL1, and a capacitor having a first electrode connected with a drain electrode of the transistor and a second electrode connected with the first split wordline SWL1.

In the first cell array 32 as described above, the first split wordline SWL1 functions as a gate electrode of an NMOS transistor, and the second split wordline SWL2 functions as a plate line electrode.

On the contrary, in the second cell array 33 as described above, the second split wordline SWL2 functions as a gate electrode of an NMOS transistor, and the first split wordline SWL1 functions as a plate line electrode.

Figure 14:
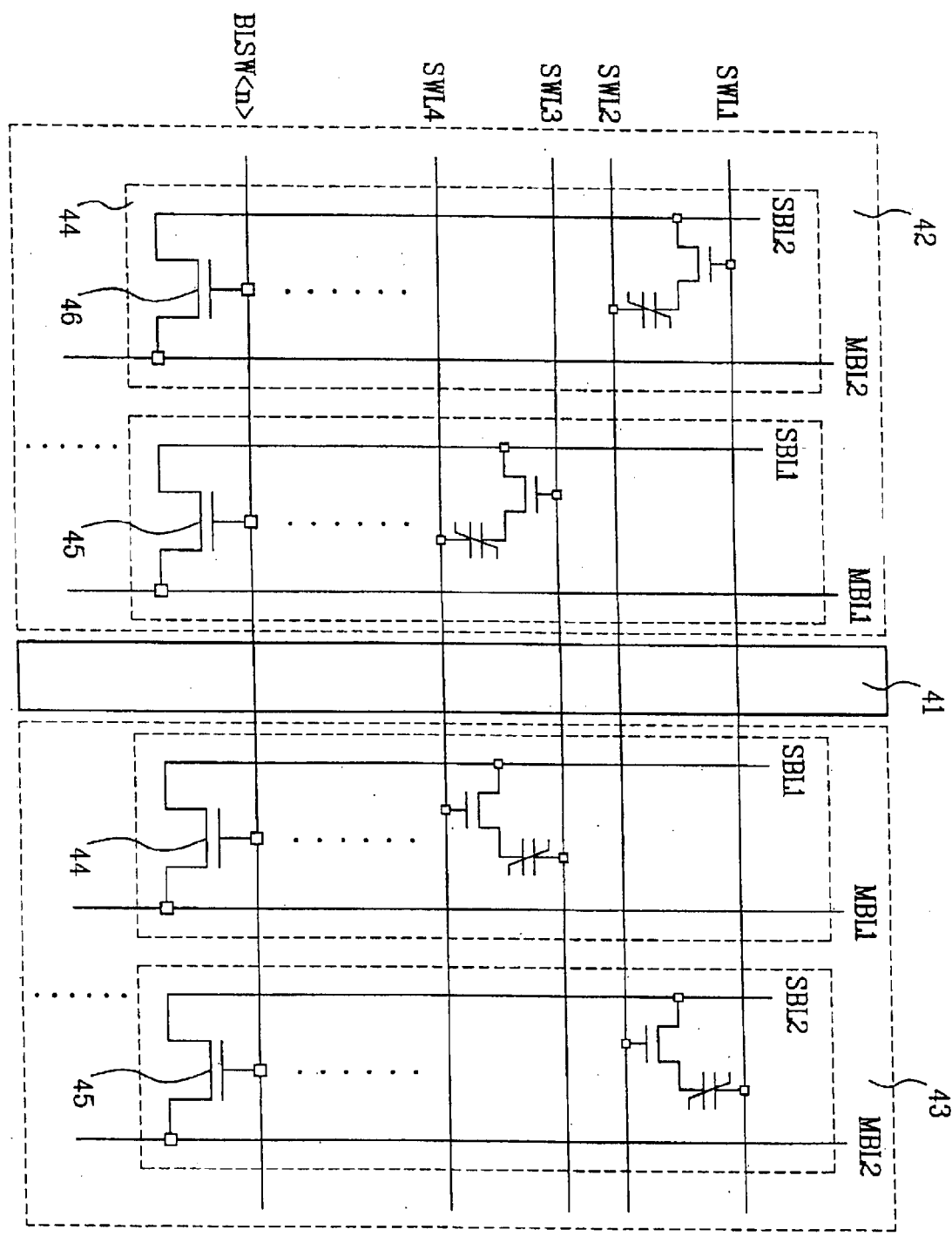
FIG. 14 is a schematic diagram showing a hierarchical folded bitline cell array having a split wordline cell array structure for a ferroelectric memory device according to another embodiment of the present invention.

FIG. 14 is a schematic diagram showing a hierachical folded bitline cell array having the structure of the split wordline cell array for the ferroelectric memory device according to another embodiment of the present invention.

As shown in FIG. 14, first and second cell arrays 42 and 43 are arranged at both sides around a split wordline 41. The first and second cell arrays 42 and 43 include first and second sub cell arrays 44 and 45.

The first and second sub cell arrays 44 and 45 include a plurality of unit cells and are arranged at regular intervals in column and row directions. Also, the first and second sub cell arrays 44 and 45 include a plurality of main bitlines MBL1 and MBL2 in one direction corresponding to the sub cell arrays 44 and 45 for the unit of column, and sub bitlines SBL1 and SBL2 arranged in the same direction with the main bitlines MBL1 and MBL2.

Each of the first and second sub cell arrays 44 and 45 has a folded cell array structure and the respective sub bitlines SBL1 and SBL2 are connected with the main bitlines MBL1 and MBL2 by a switching element 46.

The switching element 46 includes an NMOS transistor, wherein the bitline switch signal BLSW<n> in the type of a constant pulse is externally applied to a gate electrode of the NMOS transistor. A source electrode and a drain electrode of the NMOS transistor are connected with a main bitline and a sub bitline respectively.

Also, for a method of the overall cell array construction the respective split cell arrays are arranged at both sides around the split wordline driver 41.

In other words, at the left of the cell array, the first split wordline SWL1 functions as a gate electrode of an NMOS transistor, and the second split wordline SWL2 functions as a plate line electrode.

On the contrary, at the right of cell array, the second split wordline SWL2 functions as a gate electrode of an NMOS transistor, and the first split wordline SWL1 functions as a plate line electrode.

Figure 15:
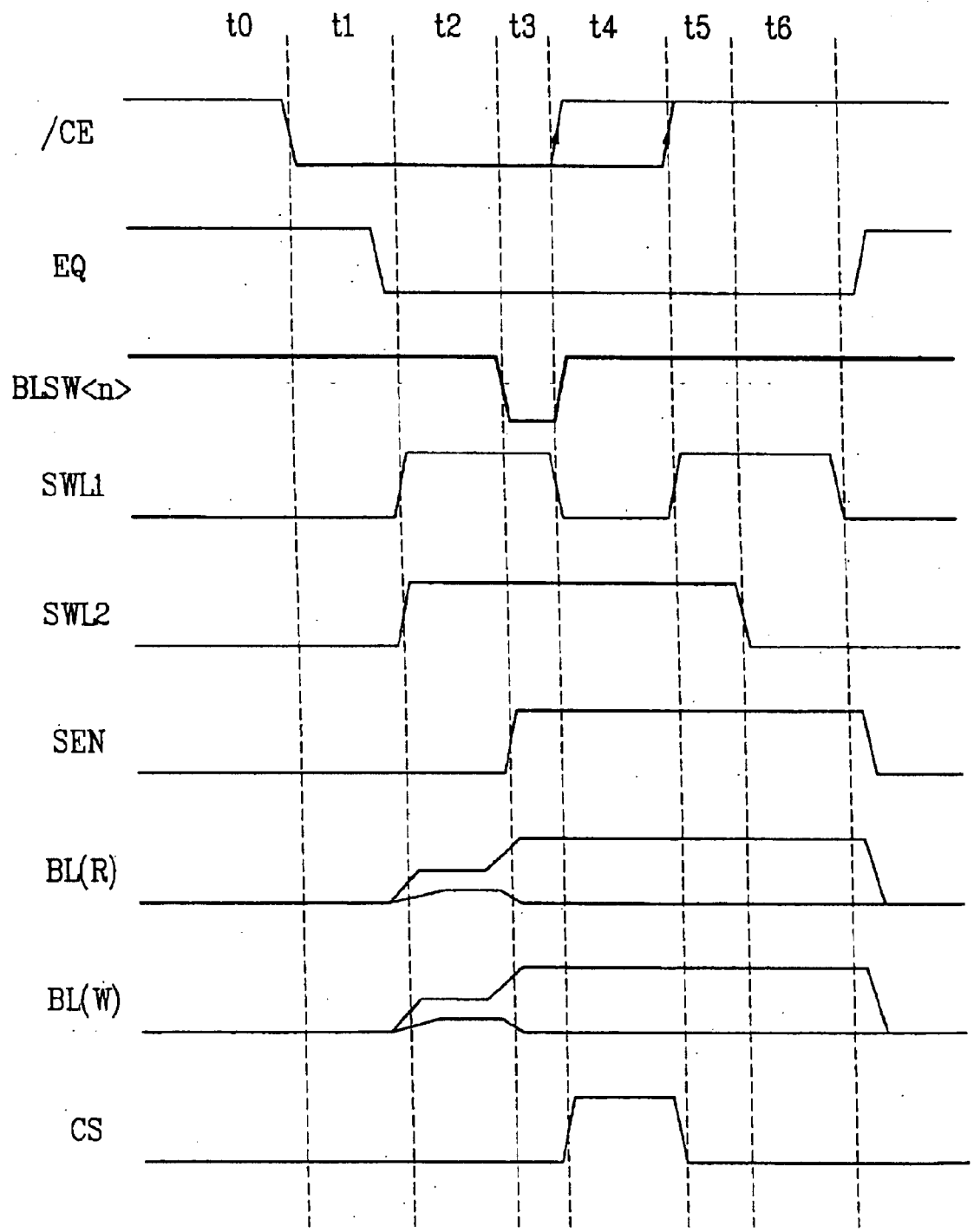
FIG. 15 is a timing diagram showing the operation according to the first embodiment of FIG. 14.

FIG. 15 is a timing diagram showing an operation according to the first embodiment of FIG. 14.

As shown in FIG. 15, the chip enable signal/CS is disabled at a low level during a period t1.

During a period t2, both a first split wordline SWL1 and a second split wordline SWL2 are enabled at high level and the cell data is loaded on the bitline. Accordingly, high or low sensing data will appear on a bitline.

During a period t3, the sensing amplifier enable signal SAE is enabled from low to high, and thereby the bitline BL data is amplified by the sensing amplifier enable signal SAE.

Also, during the period t3, the bitline switch signal BLSW<n> is disabled from high to low. That is, the bitline switch signal BLSW<n> is disabled when the sensing amplifier is enabled, and thereby the sensing margin will be improved by maintaining the same capacitance load between a reference bitline and a main bitline MBL.

During a period t5, the logic value "0" is written in the cell. During a period t4, the logic value "1" is written in the cell. During a period t6, the logic value "1" is written in the ferroelectric capacitor. Therefore, the periods t4, t5, and t6 are defined as periods during which the cell data are stored or written. In other words, they are the periods that the data of bitlines BL are newly written or rewritten in the cell in the write or read mode.

During the period t6, the bitlines BL and others are precharged for a next cycle.

Figure 16:
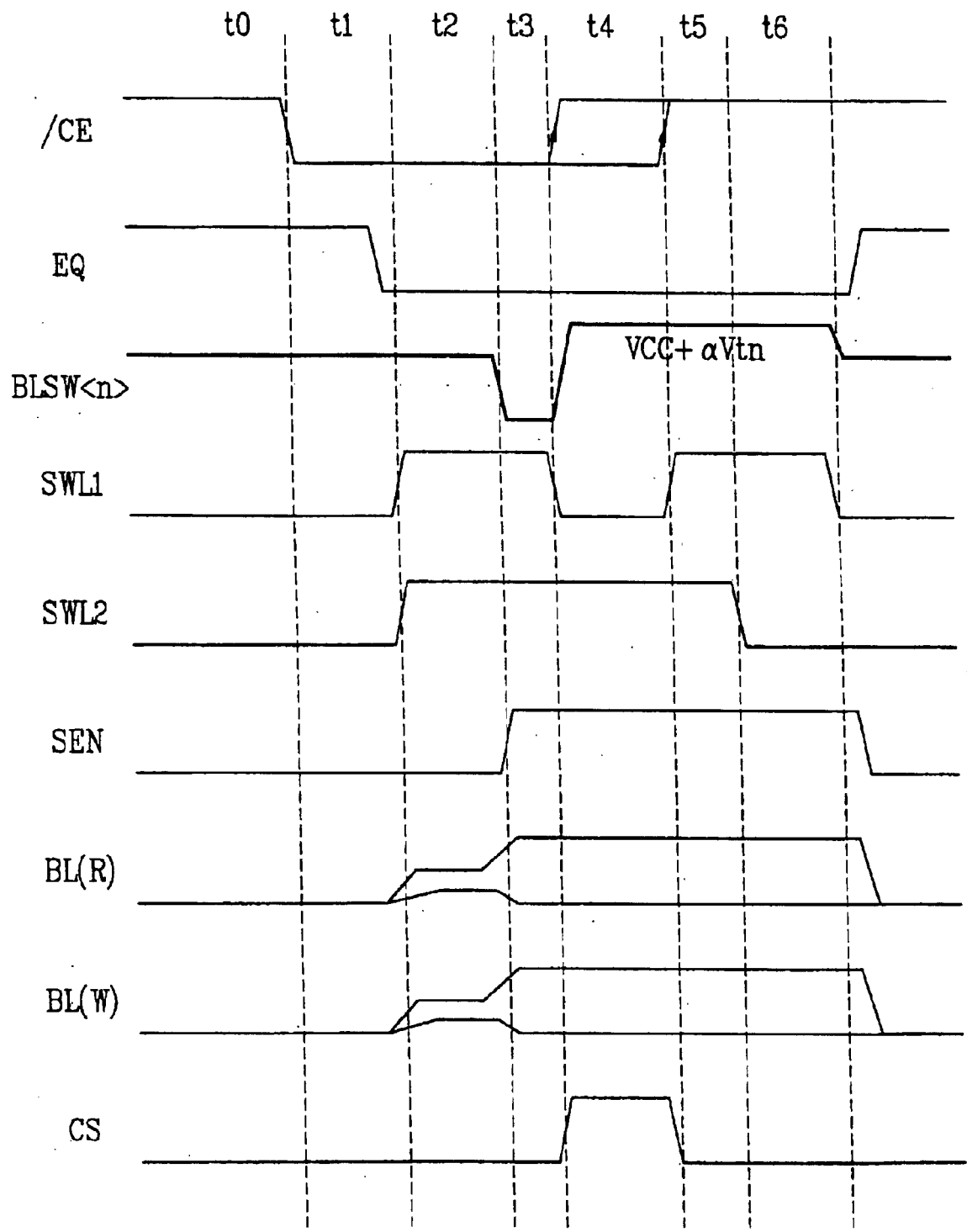
FIG. 16 is a timing diagram showing the operation according to the second embodiment of FIG. 14.

FIG. 16 is a timing diagram showing an operation according to the second embodiment of FIG. 14.

As shown in FIG. 16, during the period t3, the bitline switch signal BLSW<n> is disabled to low, but the sensing amplifier enable signal SAE is enabled.

Also, during the periods t4, t5, and t6 of the cell data being stored, the bitline switch signal BLSW<n> is boosted to the voltage VCC+αVtn higher than VCC, and thereby the voltage of the main bitline MBL can be transmitted to the sub bitline SBL without voltage loss.

Figure 17:
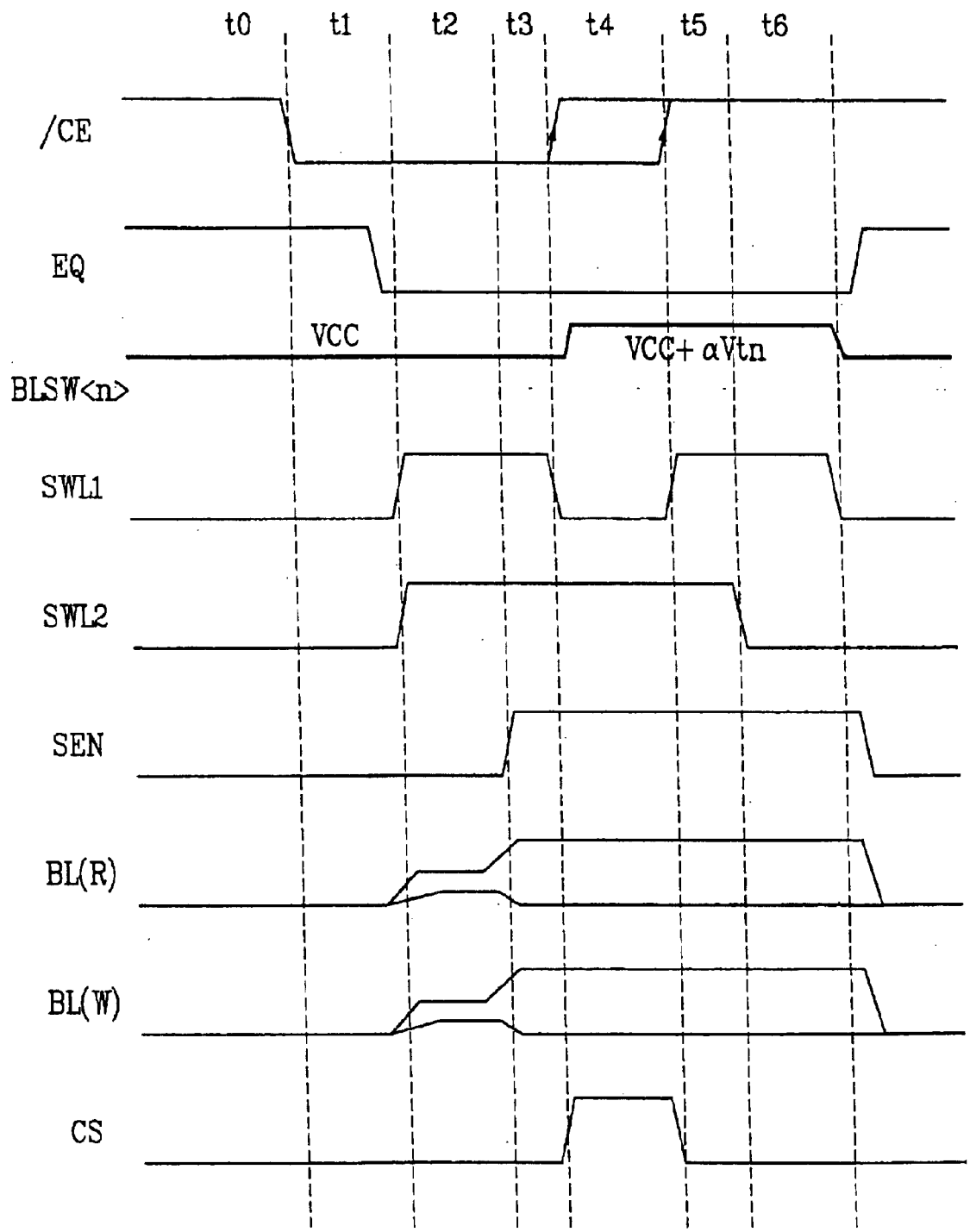
FIG. 17 is a timing diagram showing the operation according to the third embodiment of FIG. 14.

FIG. 17 is a timing diagram showing an operation according to the third embodiment of FIG. 14.

As shown in FIG. 17, the sensing amplifier enable signal SAE is enabled while the bitline switch signal BLSW<n> is maintained at high level continuously.

Also, during the periods t4, t5, and t6 of the cell data being stored, the bitline switch signal BLSW<n> is boosted to the voltage VCC+αVtn higher than VCC, and thereby the voltage of the main bitline MBL can be transmitted to the sub bitline SBL without voltage loss.

The aforementioned ferroelectric memory device and the method for driving the same have the following advantages.

First, a method of split wordline cell array is used in the folded bitline cell array so that a cell array block can be doubled in size by reducing the loading of cell array driving RC, thereby increasing cell array effect.

Second, a hierarchical structure is adopted for the construction of bitlines, and thereby the bitline capacitance can be reduced. As a result, the sensing margin of bitlines can be increased and also the size of a cell array block can be enlarged.

Finally, using a method of controlling bitline switching elements, the sensing voltage of bitlines can be controlled. In other words, as for the practical use of cell data, the connection time for a sub bitline and a main bitline is controlled regularly by controlling the bitline switching elements while the cells are operating normally, and the sensing amplifiers are enabled after the bitline switching elements are turned off. Therefore, the same bitline load can be maintained between main bitlines and sub bitlines.

It will be apparent to those skilled in the art than various modifications and variations can be made in the present invention. Thus, it is intended that the present invention covers the modifications and variations of this invention provided they come within the scope of the appended claims and their equivalents.

What is claimed is:

1. A ferroelectric memory device comprising:
a plurality of wordlines and a plurality of plate lines, the wordlines and the plate lines being alternately formed in one direction;
a plurality of sub bitlines and a plurality of main bitlines, the sub bitlines and the main bitlines alternately formed to cross the wordlines and the plate lines;
a plurality of sub cell arrays connected with the wordlines, the sub bitlines and the plate lines, having cells in directions defined by a plurality of rows and columns, the cells in the direction of the rows being arranged every two columns and the cells in the direction of the columns being arranged every two rows, respectively, wherein each of the cells includes a transistor having a gate electrode connected with one of the wordlines and a source electrode connected with one of the sub bitlines, and a ferroelectric capacitor having a terminal connected with a drain of the transistor and another terminal connected with one of the plate lines; and switching elements each operating between one of the sub bitlines and one of the main bitlines by an externally applied bitline switch signal.

2. The ferroelectric memory device according to claim 1, wherein the switching elements are each formed with a NMOS transistor.

3. The ferroelectric memory device according to claim 1, further comprising a plurality of sensing amplifier connected with the plurality of main bitlines, respectively.

4. A ferroelectric memory device comprising:

sub bitlines and main bitlines arranged in one direction;

a plurality of split wordlines arranged to cross the sub bitlines and main bitlines, wherein the split wordlines includes first split wordlines and second split wordlines;

switching elements connected between each of the sub bitlines and each of the main bitlines and operated by externally receiving a bitline switch signal;

a first cell array and a second cell array, each including a plurality of sub cell arrays having a plurality of unit cells arranged in directions defined by columns and rows, wherein each of the unit cells of the sub cell arrays within the first cell array includes a transistor having a gate electrode connected with one of the first split wordlines and a source electrode connected with one of the sub bitlines, and a ferroelectric capacitor having a terminal connected with a drain of the transistor and another terminal connected with one of the second split wordlines, and each of the unit cells of the sub cell arrays within the second cell array includes a transistor having a gate electrode connected with one of the second split wordlines and a source electrode connected with one of the sub bitlines, and a ferroelectric capacitor having a terminal connected with a drain of the transistor and another terminal connected with one of the first split wordlines; and a split wordline driver arranged between the first cell array and the second cell array.

5. The ferroelectric memory device according to claim 4, wherein the switching elements are each formed with a NMOS transistor.

6. A method for driving the ferroelectric memory device comprising a plurality of wordlines and plate lines alternately formed at regular intervals in one direction, a plurality of sub bitlines and main bitlines alternately formed at regular intervals to cross the wordlines and plate lines, a plurality of sub cell arrays connected with the wordlines, the sub bitlines, and the plate lines, having cells in directions defined by a plurality of rows and columns, the cells in the direction of the rows being arranged every two columns and the cells in the direction of the columns being arranged every two rows, and switching elements each operating between one of the sub bitlines and one of the main bitlines by an externally applied bitline switch signal of a constant pulse type to selectively connect the sub bitline with the main bitline, the method comprising the steps of:

enabling a bitline switching signal if one of the wordlines and one of the plate lines are enabled to connect adjacent sub and main bitlines with each other;

selecting only the cells connected with odd or even bitlines of the sub and main bitlines; and using the other even and odd bitlines of the sub and main bitlines corresponding to the cells, which have not been selected, as reference lines.

7. A method for driving a ferroelectric memory device comprising a plurality of wordlines and plate lines formed alternatively each other in one direction, a plurality of sub bitlines and main bitlines formed alternatively each other in a direction to cross the wordlines and plate lines, the cells connected with the wordlines, sub bitlines and plate lines in directions defined by a plurality of rows and a plurality of columns, a plurality of sub cell arrays having the cells in the direction of the rows to be arranged every other column respectively as well as the cells in the direction of the columns to be arranged every other row respectively, and switching elements each connecting one of the sub bitlines with one of the main bitlines selectively between the sub bitline and the main bitline by the operation of a bitline switch signal applied externally, the method comprising the steps of:

disabling the bitline switch signal in a constant period; and enabling a sensing amplifier in the period.

8. A method for driving a ferroelectric memory device comprising a plurality of wordlines and plate lines formed alternatively each other in one direction, a plurality of sub bitlines and main bitlines formed alternatively each other in a direction to cross the wordlines and plate lines, the cells connected with the wordlines, sub bitlines and plate lines in directions defined by a plurality of rows and a plurality of columns, a plurality of sub cell arrays having the cells in the direction of the rows to be arranged every other column respectively as well as the cells in the direction of the columns to be arranged every other row respectively, and switching elements each connecting one of the sub bitlines with one of the main bitlines selectively between the sub bitline and the main bitline by operation of a bitline switch signal applied externally, the method comprising the steps of:

disabling the bitline switch signal from high to low;

enabling sensing amplifier in a period from the high to the low; and increasing the bitline switch signal to a voltage higher than VCC during a period in which cell data is stored.

9. A method for driving a ferroelectric memory device comprising a plurality of wordlines and plate lines formed alternatively each other in one direction, a plurality of sub bitlines and main bitlines formed alternatively each other in a direction to cross the wordlines and plate lines, the cells connected with the wordlines, sub bitlines and plate lines in directions defined by a plurality of rows and a plurality of columns, a plurality of sub cell arrays having the cells in the direction of the rows to be arranged every other column respectively as well as the cells in the direction of the columns to be arranged every other row respectively, and switching elements each connecting one of the sub bitlines with one of the main bitlines selectively between the sub bitline and the main bitline by operation of a bitline switch signal applied externally, the method comprising the steps of:

enabling a sensing amplifier while the bitline switch signal maintains high continuously;

increasing the bitline switch signal to a voltage higher than VCC during a period in which cell data is stored.

10. A method for driving a ferroelectric memory device comprising a first cell array and a second cell array, each including a plurality of sub cell arrays having a plurality of unit cells arranged in directions defined by columns and rows, a split wordline driver arranged between the first and second cell arrays, sub bitlines and main bitlines arranged in one direction within the first and second sub cell arrays, a plurality of split wordlines arranged in one direction to cross the sub bitlines and main bitlines, and switching elements each connected between one of the sub bitlines and one of the main bitlines and operated by receiving a bitline switch signal applied externally, the method comprising the steps of:

disabling the bitline switch signal in a constant period; and enabling a sensing amplifier in the period.

11. A method for driving a ferroelectric memory device comprising a first cell array and a second cell array including a plurality of sub cell arrays having a plurality of unit cells arranged in directions defined by columns and rows, a split wordline driver arranged between the first and second cell arrays, sub bitlines and main bitlines arranged in one direction within the first and second sub cell arrays, a plurality of split wordlines arranged in one direction to cross the sub bitlines and main bitlines, and switching elements each connected between one of the sub bitlines and one of the main bitlines and operated by receiving a bitline switch signal applied externally, the method comprising the steps of:

disabling the bitline switch signal in a constant period;

enabling a sensing amplifier in that period; and increasing the bitline switch signal to a voltage higher than VCC during the periods in which cell data is stored.

12. A method for driving a ferroelectric memory device comprising a first cell array and a second cell array including a plurality of sub cell arrays having a plurality of unit cells arranged in directions defined by columns and rows, a split wordline driver arranged between the first and second cell arrays, sub bitlines and main bitlines arranged in one direction within the first and second sub cell arrays, a plurality of split wordlines arranged in one direction to cross the sub bitlines and the main bitlines, and switching elements each connected between one of the sub bitlines and one of the main bitlines and operated by receiving a bitline switch signal applied externally, the method comprising the steps of:

enabling a sensing amplifier while the bitline switch signal maintains high continuously; and increasing the bitline switch signal to a voltage higher than VCC during a period in which cell data is stored.

* * * * *